United States Patent
Robinson

(10) Patent No.: US 6,521,536 B1
(45) Date of Patent: Feb. 18, 2003

(54) PLANARIZATION PROCESS

(75) Inventor: Karl M. Robinson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/228,253

(22) Filed: Jan. 11, 1999

(51) Int. Cl.$^7$ ............................................ H01L 21/302
(52) U.S. Cl. ...................... 438/692; 438/697; 438/699
(58) Field of Search ................ 438/697, 699, 438/692

(56) References Cited

U.S. PATENT DOCUMENTS

| | | | |
|---|---|---|---|
| 4,680,893 A | 7/1987 | Chronkhite et al. ........... 51/5 R |
| 5,142,828 A | 9/1992 | Curry, II .................... 51/281 R |
| 5,216,843 A * | 6/1993 | Breivogel et al. .......... 51/131.1 |
| 5,514,245 A | 5/1996 | Doan et al. ............... 156/636.1 |
| 5,558,563 A | 9/1996 | Cote, et al. .................... 451/41 |
| 5,665,199 A * | 9/1997 | Sahota et al. ................. 438/14 |
| 5,665,202 A | 9/1997 | Subramanian, et al. ..... 438/692 |
| 5,720,845 A * | 2/1998 | Liu ............................. 156/345 |
| 5,786,275 A | 7/1998 | Kubo .......................... 438/692 |
| 5,913,712 A | 6/1999 | Molinar ....................... 451/41 |
| 5,957,764 A * | 9/1999 | Anderson et al. ........... 451/285 |

OTHER PUBLICATIONS

Gurtej S. Sandhu, Sujit Sharan, Low Scratch Density Chemical Mechanical Planarization Process:, 1997, pp. 1–14 Application No. 08/874,799, Filing Date Jun. 13, 1997.

* cited by examiner

Primary Examiner—Felisa Hiteshew
Assistant Examiner—V. Perez-Ramos
(74) Attorney, Agent, or Firm—Workman, Nydegger & Seeley

(57) ABSTRACT

A series of evaluation steps is described for the planarization of a semiconductor substrate, such as a semiconductor wafer, using a linear track polisher having a continuous polishing surface. In the series of evaluation steps, there is determined a first pressure and a first continuous polishing surface speed at which an optimum material removal rate can be achieved and wherein the continuous polishing surface does not accumulate glaze as is possible when planarizing doped oxides such as PSG and BPSG.

31 Claims, 4 Drawing Sheets

PLANARIZATION PROCESS

BACKGROUND OF THE INVENTION

1. The Field of the Invention

The present invention relates to the processing of semiconductor substrates, such as silicon wafers, which are used in the manufacture of semiconductor devices. The present invention more specifically relates to the polishing or planarizing of the surfaces of semiconductor substrates using a process known as chemical mechanical planarization (CMP). Methods disclosed herein improve the result of CMP processes when performed on an apparatus known as a linear track polisher.

2. The Relevant Technology

In the fabrication of integrated circuits, numerous integrated circuits are typically constructed simultaneously on a single semiconductor substrate. To reduce the cost of producing individual semiconductor devices, it has long been an objective of semiconductor manufacturers to increase the number of devices on a single substrate. For a period of time this was accomplished primarily by a continual scaling down of the geometries of individual active devices within the integrated circuits. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above. The term semiconductor substrate is contemplated to include such structures as silicon-on-insulator and silicon-on-sapphire.

Eventually, the scaling of active devices became less profitable as the limitations of the circuit speed and maximum functional density came to depend more on the characteristics of the electrical interconnects of the devices than on the scale of the devices themselves. In addition, the aspects of silicon utilization, chip costs, and ease of flexibility of integrated circuit design were also adversely affected by electrical interconnect technology restrictions. The approaches to lifting these limitations have involved the implementation of vertical stacking or integration of devices and their associated electrical interconnections, commonly referred to as multilevel interconnect (MLI) schemes. In MLI schemes, individual conductor layers are separated by dielectric layers which are sandwiched between the conductor layers. These dielectric layers are typically oxide or nitride layers which are grown or deposited on the substrate and are known as interlayer dielectrics (ILD).

One drawback of multilevel interconnection is a loss of topological planarity. Loss of planarity results in associated problems in photolithography and etch, as well as other problems. To alleviate these problems, the substrate is planarized at various points in the process to minimize non-planar topography and its adverse effects. As additional levels are added to multilevel interconnection schemes and circuit features are scaled to sub-micron dimensions, the required degree of planarization increases. Such planarization can be performed on either the conductor or the interlayer dielectric layers to remove high topography or to remove embedded particles.

The polishing process may also involve the introduction of a chemical slurry to facilitate higher removal rates and selectivity between films of the semiconductor surface. This polishing process is often referred to as chemical mechanical planarization (CMP). The chemical slurry used in CMP contains abrasives therein to assist in the mechanical removal of the layer. When fixed abrasives are incorporated into a polishing pad in a CMP processed, abrasives are not needed in the chemical slurry.

CMP is implemented in dielectric layer planarization by growing or depositing an layer, such as oxide or nitride, on the semiconductor substrate, typically to fill in contact regions or trenches between metallization lines, and then removing the excess dielectric material using the CMP process, until a flat, smooth surface is achieved.

CMP processes have been used in the semiconductor industry for many years. A primary application of CMP processing has been the polishing of silicon substrates, such as silicon wafers, before active device fabrication. Only in recent years has the CMP process been applied to planarizing metallization layers and their inter-dielectric layers, and these new applications are the result of integrated circuit device fabrication processing scaling down to deep submicron geometries. A major hurdle to overcome in adapting CMP processes to the planarization of metallization and dielectric layers is that the typical thicknesses of the layers being planarized, and the variations in final thicknesses allowed over the entire surface area of the layers, are smaller than the critical dimensions associated with earlier semiconductor applications.

In addition to the need for tight tolerances in the planarizing of semiconductor metal and dielectric layers, there is a continuing need to reduce the amount of process time associated with the CMP material removal steps.

A type of apparatus known as a rotational polisher has been used widely in the practice of chemical mechanical planarization. The rotational polishing process involves holding and rotating a thin flat semiconductor substrate against a wetted polishing surface under controlled pressure and temperature. An example of such an apparatus is the Model 372 Polisher manufactured and distributed by IPEC Westech Systems, of San Jose, Calif.

FIG. 1 shows a rotational polisher 11 having a rotatable polishing platen 12, a substrate polishing head assembly 14 and a chemical supply system 18. Platen 12 is typically covered with a replaceable, relatively soft material 16 such as polyurethane.

Substrate polishing head assembly 14 holds semiconductor substrate 10 adjacent to platen 12. Substrate polishing head assembly 14 includes a motor (not shown) for rotating the polishing head and semiconductor substrate 10. Substrate polishing head assembly 14 further includes a polishing head displacement mechanism (not shown) which moves the substrate 10 back and forth across the platen 12 as it is rotating. Substrate polishing head assembly 14 applies a controlled downward pressure to semiconductor substrate 10 to hold semiconductor substrate 10 against rotating platen 12 so that a continuous polishing surface 34 on rotating platen 12 polishes semiconductor substrate 10. Chemical supply system 18 introduces a polishing slurry (not shown) to be used as an abrasive medium between platen 12 and semiconductor substrate 10.

Limitations of conventional rotational CMP polishing apparatus and processes are known to exist. It is necessary to have a constant material removal rate across the entire surface of the substrate, but the removal rate is related to the radial position of the substrate on the platen. The removal rate is increased as the semiconductor substrate is moved radially outward relative to the polishing platen due to higher platen rotational velocity. Additionally, removal rates tend to be higher at the edge of the substrate than at the center of the substrate because the edge of the substrate is rotating at a higher speed than the center of the substrate. FIG. 2 illustrates a perspective view, not to scale, of a topology having a typical thickness profile on a semiconductor substrate 10 which is an example of that which may be realized when planarizing a semiconductor substrate using rotational polisher 11 as described above.

Doped silicon dioxide layer materials known as borophosphosilicate glass (BPSG), phosphosilicate glass (PSG), borosilicate glass (BSG) are used widely in the fabrication of semiconductor devices, and have been further used to provide a measure of surface planarity. Phosphorus-doped oxides are known to have numerous properties which are beneficial to the long term reliability of semiconductor devices, such as providing an improved barrier to moisture penetration, and acting as an effective trap for mobile ionic contaminants. In addition, BSG, PSG and BPSG materials have been used to achieve a measure of substrate surface planarity by depositing a BSG, PSG or BPSG layer on a substrate surface, then heating the substrate to flow the glass and planarize the layer. Such a technique is commonly referred to as reflow and has proven useful in the fabrication of semiconductor devices with relatively large geometries. BPSG films reduce reflow temperatures in such processes because boron plays a principal role in the lowering of glass viscosity.

Limitations to the use of BSG, PSG and BPSG reflow are known to exist, particularly when fabricating semiconductors which have relatively small device geometries or which have three or more dielectric/metal layers. The total thermal budget available to the reflow processes for such devices has to be minimized. Consequently, in order to produce the same degree of planarization obtained in higher temperature processes, the dopant concentration in the BPSG film must be further increased. When working with dimensions below 0.35 microns, however, higher doping levels of boron and phosphorus in the doped film fail to achieve the desired results, and CMP processes must be used on these layers in addition to reflow to fully planarize the substrate surface.

Planarization methods have been developed using a linear track polisher. An example of a linear track polisher is that which is manufactured by OnTrak Systems, Incorporated, of Milpitas, Calif. FIG. 3 shows an example of such an apparatus. Linear track polisher 30 includes a substrate polishing head assembly 32, a continuous belt having a continuous polishing surface 34 thereon, and a chemical mixture feed assembly 36.

A constant downward pressure is applied to the substrate polishing head assembly 32, holding a semiconductor substrate 10 against continuous polishing surface 34. Belt drive motors drive two belt drums 38 which cause continuous polishing surface 34 to move in the direction as indicated by arrows seen in FIG. 3. Continuous polishing surface 34 may consist of a polyurethane type material The chemical mixture feed assembly 36 delivers an aqueous mixture to the region where semiconductor substrate 10 makes contact with continuous polishing surface 34. The aqueous mixture is typically a colloidal slurry with abrasive characteristics suitable for the specific type of material being removed. In another embodiment, continuous polishing surface 34 may also contain fixed abrasives incorporated into a resin material. In the case of this other embodiment of continuous polishing surface 34, the aqueous mixture need not have abrasive characteristics.

The removal rate of material from the surface of the semiconductor substrate is determined by Preston's relationship which derives a mechanical removal rate, RR:

$$RR=K_p*P*S;$$

where

P is the applied pressure;

S is the relative velocity between the substrate surface and the surface of the polishing pad or belt; and $K_p$ is the proportionality constant, or Preston's coefficient, and is a function of temperature, slurry (pH, concentration, particle size), film properties, and polishing pad factors.

As seen in Preston's relationship, by increasing the speed of continuous polishing surface 34 on the continuous belt of the linear track polisher, or by increasing the downward pressure on substrate polishing head assembly 32, the removal rate of material is increased proportionately.

Taking advantage of the Preston's relationship, linear track polishers have the potential to achieve much higher material removal rates than rotational polishers, due to the high continuous belt speeds achievable, but limitations are known to exist. For instance, an increase in the removal rate, which can be achieved either by increasing the downward pressure or increasing the speed of continuous polishing surface 34, will also increase the probability that the material being removed from the surface of semiconductor substrate 10 will cause scratches or other surface defects as the surface material is being carried away, thereby damaging semiconductor substrate 10. Defects of this kind may cause electrical shorts between two conductive lines, improper optical scattering during subsequent patterning steps, or the nonadherence of subsequently deposited materials to the semiconductor substrate surface. Any of these or other similar problems caused by surface defects render the substrate unsuitable for further processing.

A further limitation exists for low or reduced viscosity layers, such as BSG, PSG or BPSG. The viscosity of these layers is reduced for increased dopant concentrations. The reduced viscosity of layers of this type can cause a glaze to accumulate on continuous polishing surface 34. The result of such glazing is a covering of the pores on continuous polishing surface 34, thereby inhibiting the ability of continuous polishing surface 34 to remove further material from the surface of semiconductor substrate 10. When this occurs, linear track polisher 30 must be stopped to recondition continuous polishing surface 34, thereby reducing the overall rate at which semiconductor substrates can be processed. A further effect of glazing is that the effective removal rate of the material from the surface of semiconductor substrate 10 can no longer be predicted by Preston's relationship, thereby greatly reducing the ability to control the total amount of material removed during a planarization step.

While the linear track polisher has shown potential for improving the rate of material removal during a CMP operation on a semiconductor substrate, thereby improving the rate at which semiconductor substrate can be processed, advancements are needed to simplify the processing and improve the results obtained.

SUMMARY OF THE INVENTION

A novel method for the planarization of a semiconductor substrate is disclosed herein. The novel method is performed on a linear track polisher. The linear track polisher includes a substrate polishing head assembly in which the semiconductor substrate is affixed so that a front planar surface of the semiconductor substrate forms a polishing interface with a continuous polishing surface situated on a continuous belt. An aspect of the novel method is a routine for optimizing the speed for a selected time period at which the continuous polishing surface is moving so as to effect a maximum material removal rate from the front planar surface of the semiconductor substrate for a given pressure of the continuous polishing surface on the front planar surface of the semiconductor substrate.

BRIEF DESCRIPTION OF THE DRAWINGS

A more particular description of the invention briefly described above will be rendered by reference to specific embodiments and applications thereof which are illustrated in the appended drawings. Understanding that these drawings depict only typical embodiments and applications of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Advantages of the present invention will become readily apparent to those skilled in this art from the following detailed description, wherein preferred embodiments of the invention are shown and described in the disclosure, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

Figure 1:
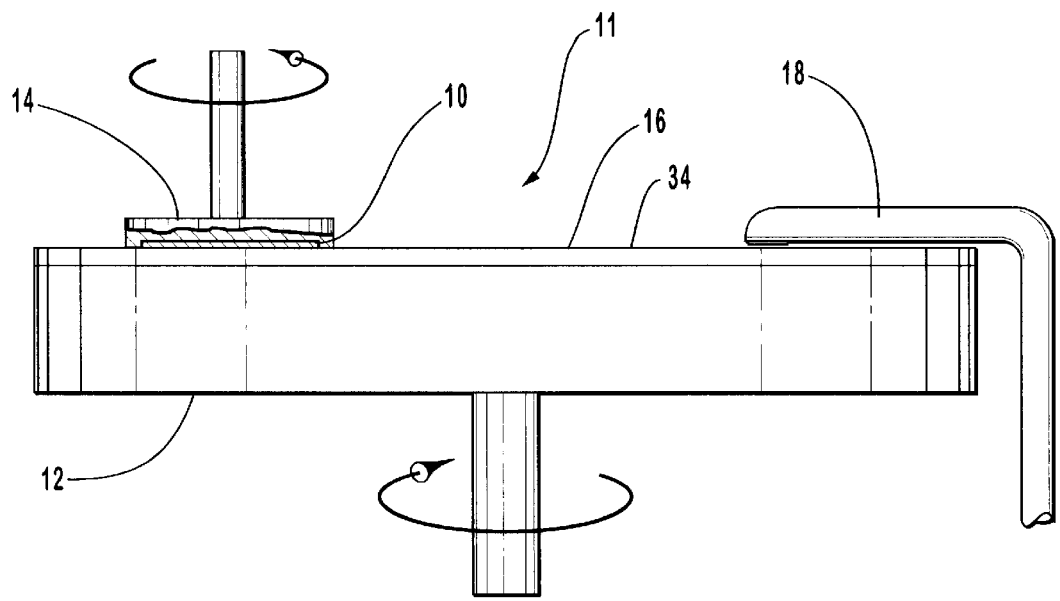
FIG. 1 is a simplified schematic of a rotational polishing apparatus for performing a planarizing operation on a semiconductor substrate.
Figure 2:
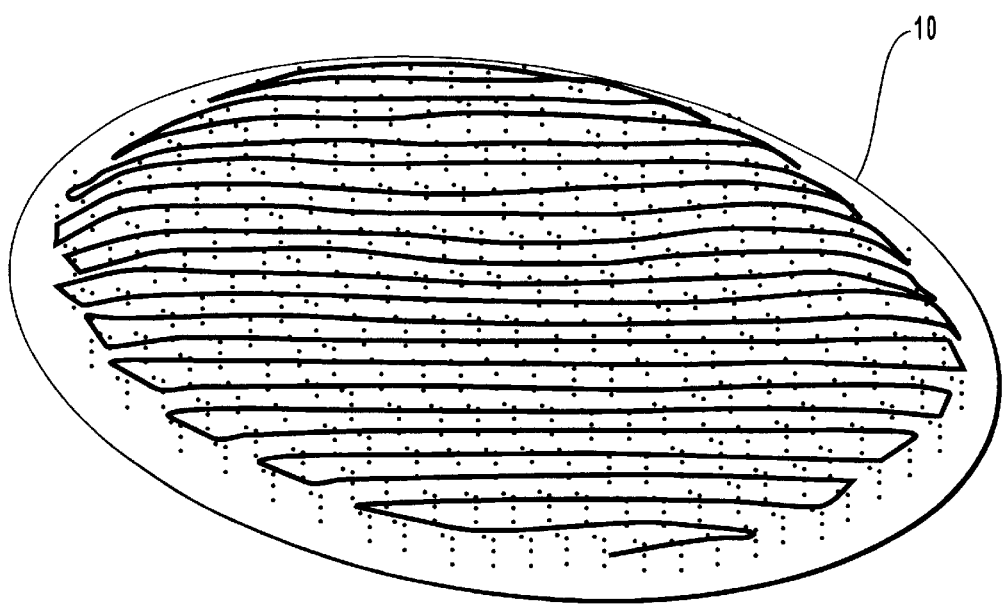
FIG. 2 is an illustration of a semiconductor substrate after planarization.
Figure 3:
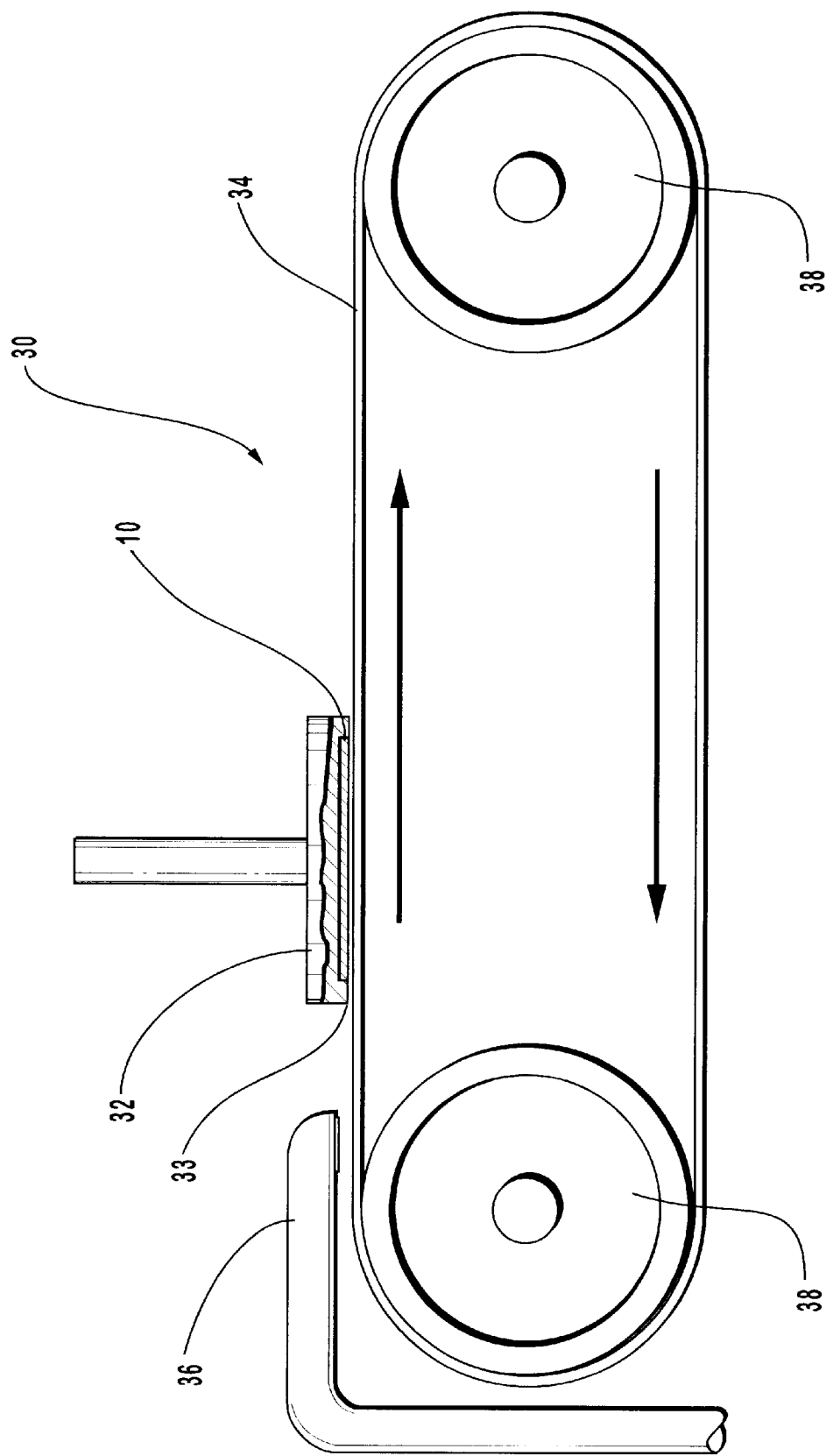
FIG. 3 is a simplified schematic of a linear track polishing apparatus.
Figure 4:
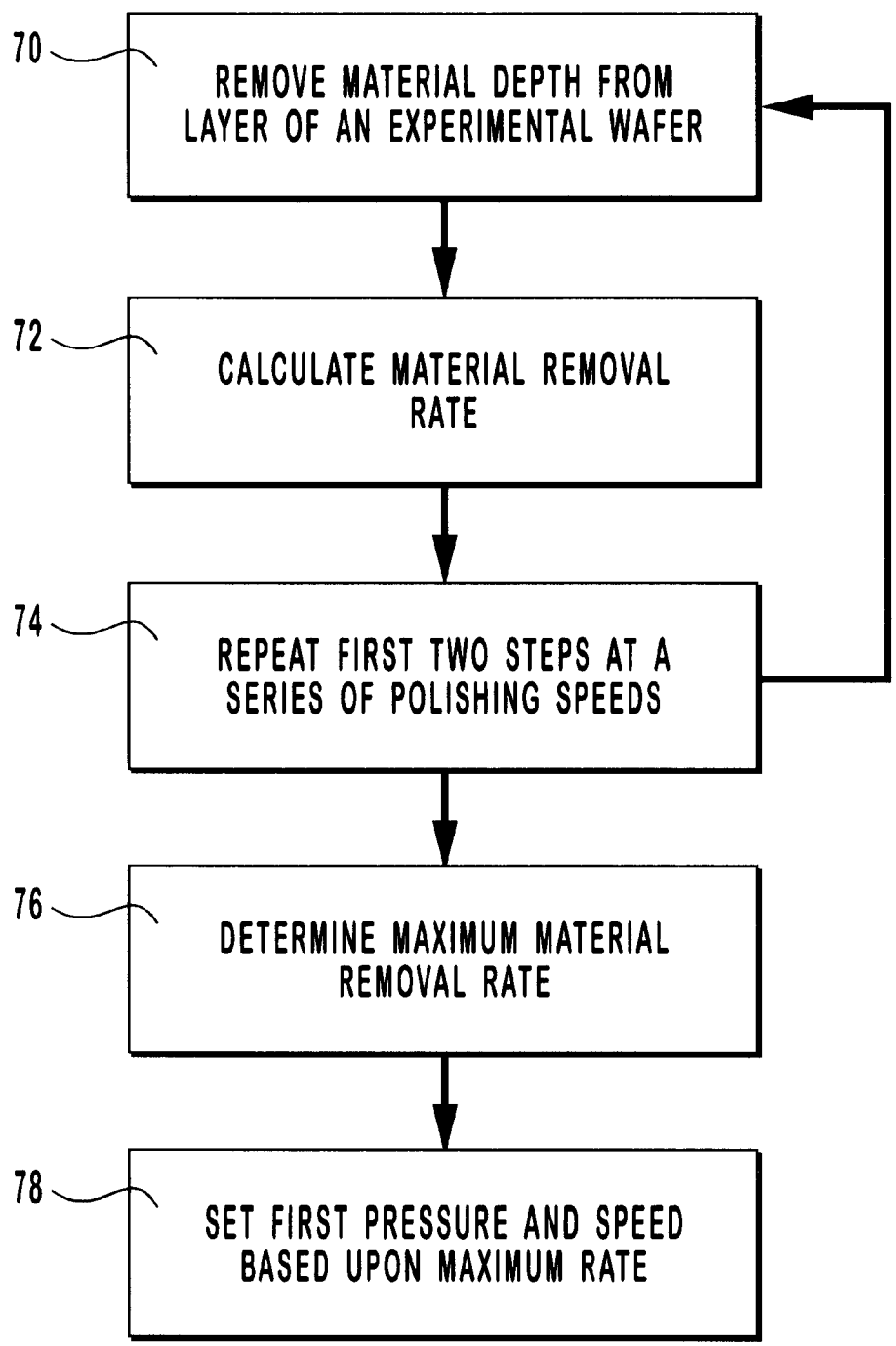
FIG. 4 is a block diagram of a method for determining an optimum continuous polishing surface speed for a linear track CMP apparatus.

An aspect of the inventive method is the optimization of the belt speed of a linear track polisher so as to maximize the material removal rate from the front planar surface of the semiconductor substrate. This aspect is illustrated in FIG. 4, which is particularly useful where the front planar surface of the semiconductor substrate has a low or reduced viscosity layer thereon, such as BSG, PSG or BPSG. The viscosity of these layers is reduced for increased dopant concentrations. The reduced viscosity of layers of this type can cause a glaze to accumulate on the continuous polishing surface on the continuous belt of the linear track polisher. The inventive method minimizes the problem of glazing For linear track polishers, it has been observed in the planarization of $SiO_2$ layers grown or deposited on semiconductor substrates using a slurry having a composition of ammonia or KOH with a base pH in a range from about 8 to about 12 and preferably about 1. By way of example, a suitable slurry is Rodel ILD 1300 manufactured by Rodel Co. located in Newark, Del.

As seen in FIG. 4, a method is disclosed for determining optimum settings for the first polishing speed by the steps 70 through 78, which comprise removing a material depth of a material layer from a front planar surface of an experimental semiconductor substrate on a linear track polisher 30 in step 70, by operating the linear track polisher at an experimental interface polishing pressure between the front planar surface of semiconductor substrate and the continuous polishing surface at a continuous belt speed for a selected experimental time in a range of about 5 seconds to about 300 seconds, and preferably in a range of about 15 seconds to about 240 seconds.

In step 72, calculating a material removal rate from the front planar surface of the semiconductor substrate based upon the magnitude of the material depth removed from the front planar surface of semiconductor substrate divided by the experimental time. In step 74, determining the response of the material removal rate with respect to the continuous polishing surface speed by repeating steps 70 and 72 a selected number of times, wherein the continuous polishing surface speed is varied over a selected range of values, in selected increments.

In step 76, determining an optimum continuous polishing surface speed at which there is a maximum material removal rate from the front planar surface of the semiconductor by evaluating the response of the material removal rate from the front planar surface of the semiconductor and determining the value of the continuous polishing surface speed at which the material removal rate achieves a maximum value. In step 78, setting the first polishing speed at the optimum continuous polishing surface speed. As an alternative, the first polishing speed can be set below the optimum continuous polishing surface speed by a selected amount, and the first polishing pressure can be set to a value in a range from about 50 percent to about 90 percent of the experimental interface polishing pressure.

Figure 5:
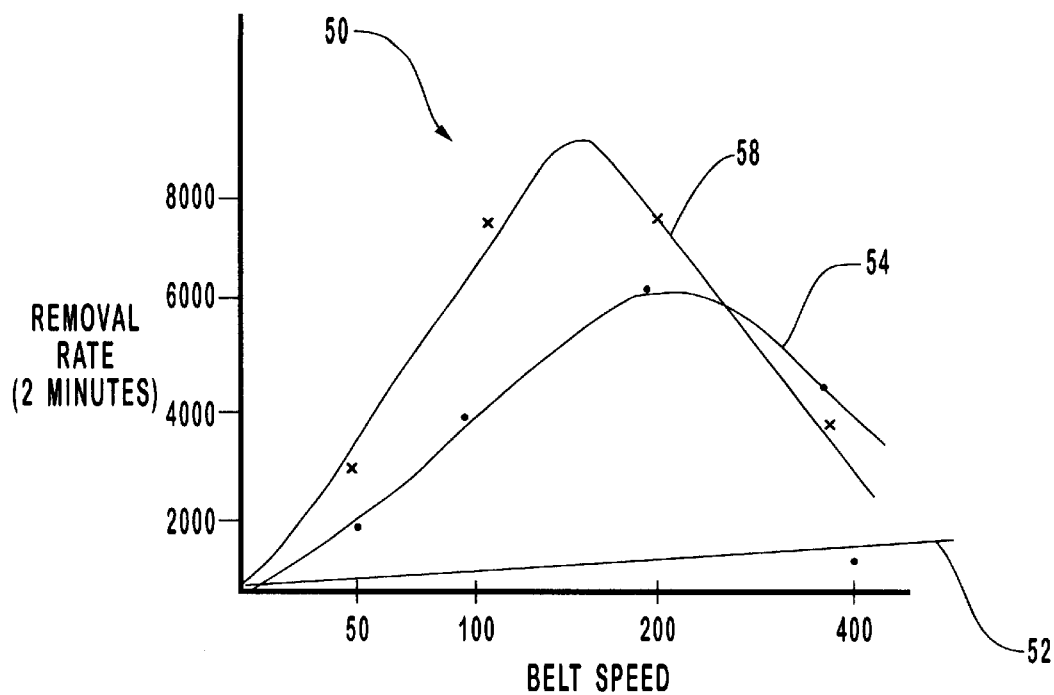
FIG. 5 is a graph showing typical CMP material removal rates versus belt speed for doped and undoped silicon dioxide layers on a linear track CMP apparatus.

The foregoing novel method for determining an optimum belt speed for maximum material removal rate from the front planar surface of the semiconductor substrate is explained by example below in additional detail by reference to FIGS. 5–6.

FIG. 4 is a block diagram illustrating evaluation steps to determine optimum linear track belt settings. The evaluation steps involve the use of information illustrated in FIGS. 5 and 6. FIG. 5 contains a graph 50 which illustrates the relationship, for each of responses 52, 54, and 58, of belt speed to material removal rate for various doping concentrations in a silicon dioxide layer. Response 52 shows the relationship between belt speed and a substantially undoped silicon dioxide layer. Responses 54 and 58 reflect higher concentrations of doping in silicon dioxide layers. Responses 52, 54, and 58 on graph 50 were determined by performing evaluation steps 70 and 72 one time to obtain each data point shown. Evaluation steps 70 and 72 were performed to calculate the total amount of oxide material removed over a two minute time period for each of the three doping concentrations and at various speeds of linear track continuous polishing surface 34, according to third evaluation step 74.

It is observed from graph 50 that Preston's relationship between the belt speed and the material removal rate remains in effect for all typical linear track belt speeds when processing an undoped layer of TEOS oxide as shown in material removal rate response 52. In the case of the BPSG materials however, the material removal rates are much higher, but reach a peak at a belt speed of approximately 150 feet/minute and then begin to decrease due to glazing of the continuous polishing surface 34. Stated empirically, a belt speed of about 150 feet/minute is the maximum continuous polishing surface speed (S) to move the polishing surface while applying a constant polishing pressure (P) while applying a slurry thereto, where the material removal rate (RR) of BPSG is substantially linear for Preston's Relationship $RR=K_p*P*S$, where $K_p$ is Preston's coefficient for the forgoing polishing process. Accordingly, a belt speed higher than 150 feet/minute will result in a lower RR and non-linear result in Preston's relationship. As such, it is preferred to set the belt speed in a range from about (0.5*S) to about (0.8*S) so as to avoid glazing of the polishing pad.

Figure 6:
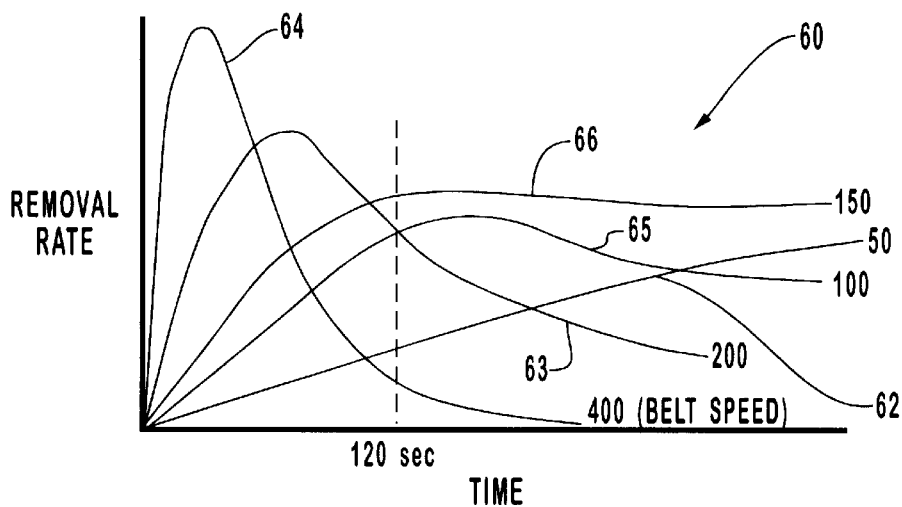
FIG. 6 is a graph showing typical CMP material removal rates versus time for various belt speeds on a linear track CMP apparatus.

FIG. 6 contains a graph 60 of effective material removal rates versus time of a richly doped BPSG layer with individual responses for five linear track belt speeds, further illustrating the reason for the peaking of the effective material removal rates for BPSG. For lowest belt speed response 62, the removal rate increases slowly but steadily over time. For highest belt speed response 64, the removal rate increases sharply but rapidly declines as continuous polishing surface 34 begins to glaze. For optimal belt speed response 66, the removal rate rises steadily to a maximum value within approximately 120 seconds and then substantially holds this value for the remainder of a typical polishing cycle. The increase in removal rate of response 66 over the first 120 seconds is due to factors such as abrasive slurry flows and surface temperatures which have not yet reached equilibrium conditions. Those skilled in the art will observe that the optimum continuous polishing surface speed for response 64 corresponds to the continuous polishing surface speed in FIG. 5 at which the material removal rate of responses 54 and 58 reach their maximum value.

A fourth evaluation step 76 is then accomplished by reviewing a material removal response curve obtained by performing evaluation steps 70, 72, and 74, on one or more semiconductor substrates, as is necessary to obtain a set of material removal rate values for a material of a given composition. Using graphical or numerical techniques, the continuous polishing surface speed at which the material removal rate reaches its maximum value is determined for a time period in a range of about 15 seconds to about 240 seconds, and preferably 120 seconds. The period of time is related to the material of which the front planar surface of the semiconductor substrate is composed.

Finally in fifth evaluation step 78, the first belt is set at an optimum value, which is preferably equal to or slightly less than the maximum material removal rate as determined in fourth evaluation step 76. In the preferred embodiment of this evaluation method, the first polishing pressure of the fifth evaluation step 74 would be set equal to the experimental interface polishing pressure, although a pressure less than the value thereof, or about 50 percent to about 80 percent of the experimental interface polishing pressure could be used.

While an embodiment of the present invention which is useful for the chemical mechanical planarization of PSG and BPSG has been described here, those skilled in the art will realize that the phenomenon of the glazing of continuous polishing surface 34 may occur for numerous other materials, particularly for materials of low viscosity, and the application of this invention should not be considered as limited to the material types described herein.

The present invention may also be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A planarization method on a planarizing apparatus having a continuous polishing surface and a substrate polishing head assembly in which a semiconductor substrate is retained so that the front surface of said semiconductor substrate forms a polishing interface with said continuous polishing surface, said method comprising:

for each of a number of continuous polishing surface speeds, determining the corresponding material removal rate by:
removing a material from the front surface of a first semiconductor substrate with said continuous polishing surface of said planarizing apparatus by operating said planarizing apparatus at a constant first polishing pressure and at said continuous polishing surface speed at a time while applying a fluid to a region including the polishing interface, said continuous polishing surface moving in a linear direction relative to said semiconductor substrate such that said continuous polishing surface continuously contacts the front surface of the semiconductor substrate; and
calculating said material removal rate based upon the magnitude of the material removed from said front surface of the first semiconductor substrate for the time;

evaluating the number of continuous polishing surface speeds and the corresponding material removal rate so as to derive therefrom a derived continuous polishing surface speed which achieves maximum removal of said material from the front surface of the first semiconductor substrate.

2. The method of claim 1, further comprising polishing a second semiconductor substrate having a material on the front surface of the second semiconductor substrate that is substantially the same material as that of the front surface of the first semiconductor substrate by:

setting a first polishing speed to a value less than said derived continuous polishing surface speed; and moving the continuous polishing surface at said first polishing speed while applying said first polishing pressure to the substrate polishing head assembly against the second semiconductor substrate for said time while applying said fluid to said region including the polishing interface.

3. The method of claim 2, wherein the first polishing speed is set in a range of about 60 to about 70 percent of said continuous polishing surface speed.

4. The method of claim 1 wherein said time is in a range from about 5 seconds to about 300 seconds.

5. The method of claim 4, wherein:

the material removed from the front surface of the semiconductor substrate is doped silicon dioxide; and the time is in a range from about 120 seconds to about 240 seconds.

6. The method of claim 1, wherein the continuous polishing surface comprises fixed abrasives and wherein the fluid is substantially free of abrasives.

7. The method of claim 1, wherein the material being removed from the front surface of the first semiconductor substrate is selected from the group consisting of BSG, PSG, and BPSG.

8. The method of claim 1, wherein the continuous polishing surface is on an endless belt that is situated on a linear track polisher.

9. A planarization method comprising:
provinding a linear track polisher having a continuous polishing surface on an endless belt and a substrate polishing head assembly in which a semiconductor substrate is retained so that the front surface of said semiconductor substrate forms a polishing interface with said continuous polishing surface;
for each of a number of continuous polishing surface speeds, determining the corresponding material removal rate by:
removing a material from the front surface of a first semiconductor substrate with said continuous polishing surface of said endless belt by operating said linear track polisher at a constant first polishing pressure and at said continuous polishing surface speed at a time while applying a fluid to a region including the polishing interface, said continuous polishing surface moving in a linear direction relative to said semiconductor substrate such that said continuous polishing surface continuously contacts the front surface of the first semiconductor substrate, wherein the material being removed from the front surface of the first semiconductor substrate is selected from the group consisting of BSG, PSG, and BPSG, and
calculating said material removal rate based upon the magnitude of the material removed from said front surface of the first semiconductor substrate for the time;
evaluating the number of continuous polishing surface speeds and the corresponding material removal rate so as to derive therefrom a derived continuous polishing surface speed which achieves maximum removal of said material from the front surface of the first semiconductor substrate;
polishing a second semiconductor substrate having a material on the front surface of the second semiconductor substrate that is substantially the same material as that of the front surface of the first semiconductor substrate by:
setting a first polishing speed to a value less than said derived continuous polishing surface speed; and
moving the continuous polishing surface at said first polishing speed while applying said first polishing pressure to the substrate polishing head assembly against the second semiconductor substrate for said time while applying said fluid to said region including the polishing interface.

10. A planarization method on a planarizing apparatus having a continuous polishing surface and a substrate polishing head assembly in which a semiconductor substrate is retained so that the front surface of said semiconductor substrate forms a polishing interface with said continuous polishing, surface, said method comprising:
for each of a number of continuous polishing surface speeds, determining the corresponding material removal rate (RR) by:
removing a material from the front surface of a first semiconductor substrate with said continuous polishing surface of said planarizing apparatus by operating said planarizing apparatus at a constant first polishing pressure (P) and at said continuous polishing surface speed at a time while applying a fluid to a region including the polishing interface said continuous polishing surface moving in a linear direction relative to said first semiconductor substrate such that said continuous polishing surface continuously contacts the front surface of the first semiconductor substrate; and
calculating said material removal rate based upon the magnitude of the material removed from said front surface of the first semiconductor substrate for the time;
evaluating the number of continuous polishing surface speeds and the corresponding material removal rate so as to derive therefrom a derived continuous polishing surface speed (S) which achieves maximum removal of said material from the front surface of the first semiconductor substrate, wherein:
RR is linear for the equation $RR=K_p P*S$; and
$K_p$ is Preston's coefficient.

11. The method of claim 10, further comprising polishing a second semiconductor substrate having a material on the front surface of the second semiconductor substrate that is substantially the same material as that of the front surface of the first semiconductor substrate by moving the continuous polishing surface at a first polishing speed in a range from about $(0.5*S)$ to about $(0.8*S)$ while applying said first polishing pressure to the substrate polishing head assembly against the second semiconductor substrate for said selected time while applying said fluid to said region including the polishing interface.

12. The method of claim 10, wherein the material being removed from the front surface of the first semiconductor substrate is selected from the group consisting, of BSG, PSG, and BPSG.

13. The method of claim 10, wherein the continuous polishing surface comprises fixed abrasives, and the fluid is substantially free of abrasives.

14. The method of claim 11, wherein the material being removed from the front surface of the first semiconductor substrate is selected from the group consisting of BSG, PSG, and BPSG.

15. The method of claim 10, wherein the continuous polishing surface is situated on a linear track polisher.

16. The method of claim 11, wherein:
the material being removed from the front surface of the second semiconductor substrate is doped silicon dioxide; and
the time is in a range from about 120 seconds to about 240 seconds.

17. The method of claim 10, wherein the first polishing speed is set in a range of about 60 to about 70 percent of said continuous polishing surface speed.

18. A planarization method comprising:
providing a linear track polisher having a continuous polishing surface on an endless belt and a substrate polishing head assembly in which a semiconductor substrate is retained so that the front surface of said semiconductor substrate forms a polishing interface with said continuous polishing surface;
for each of a number of continuous polishing surface speeds, determining the corresponding material removal rate (RR) by:
removing a material from the front surface of a first semiconductor substrate with said continuous polishing surface of said endless belt by operating said linear track polisher at a constant first polishing pressure (P) and at said continuous polishing surface speed at a time while applying a fluid to a region including the polishing interface, said continuous polishing surface moving in a linear direction relative to said first semiconductor substrate such that said continuous polishing surface continuously contacts the front surface of the first semiconductor substrate, wherein the material being removed from the front surface of the first semiconductor substrate is selected from the group consisting of BSG, PSG, and BPSG; and calculating said material removal rate based upon the magnitude of the material removed from said front surface of the first semiconductor substrate for the time;

evaluating the number of continuous polishing surface speeds and the corresponding material removal rate so as to derive therefrom derived continuous polishing surface speed (S) which achieves maximum removal of said material from the front surface of the first semiconductor substrate, wherein:

RR is linear for the equation $RR = K_p * P * S$; and $K_p$ is Preston's coefficient polishing a second semiconductor substrate having a material on the front surface of the second semiconductor substrate that is substantially the same material as that of the front surface of the first semiconductor substrate by moving the continuous polishing surface at a first polishing speed in a range from about (0.5*S) to about (0.8*S) while applying said first polishing pressure to the substrate polishing head assembly against the second semiconductor substrate for said time while applying said fluid to said region including the polishing interface.

19. The method of claim 18, wherein the continuous polishing surface comprises fixed abrasives, and the fluid is substantially free of abrasives.

20. The method of claim 18, wherein said time is in a range about 5 seconds to about 300 seconds.

21. The method of claim 18, wherein the first polishing speed is set in a range from about (0.6*S) to about (0.7*S).

22. A method for removing a material from a front surface of a substrate with an endless belt having a polishing surface thereon, the polishing surface having a constant pressure (P) upon the front surface of the substrate, said method comprising:

for each of a plurality of different constant speeds (S) of the polishing surface moving in a constant linear direction relative to the front surface of a first substrate over a fixed time period at said constant pressure (P), determining a corresponding material removal rate (RR) of said material removed from said front surface of said first substrate; and evaluating each said S and the corresponding RR thereof so as to derive therefrom a derived speed (DS) of the polishing surface relative to the front surface of said first substrate over said fixed time period at said constant pressure (P) that has the maximum removal of said material.

23. The method of claim 22, wherein for each said S and the corresponding, RR thereof:

RR is linear for the equation $RR = K_p * P * S$; and $K_p$ is Preston's coefficient.

24. The method of claim 22, wherein the fixed time period is in a range from about 5 seconds to about 300 seconds.

25. The method of claim 22, wherein the material is doped silicon dioxide and the fixed time period is in a range from about 120 seconds to about 240 seconds.

26. The method of claim 22, further comprising removing a material from the front surface of a second substrate that is the same material as that of the front surface of the first semiconductor substrate by moving the polishing surface at 50 to 80 percent of DS over said fixed time period at said constant pressure (P).

27. The method of claim 22, wherein the endless belt is situated on a linear track polisher.

28. The method of claim 22, wherein:

the polishing, surface and the front surface of the first substrate form an interface; and a fluid is applied to the interface while removing said material from the front surface of the first substrate.

29. The method of claim 28, wherein:

the polishing surface comprises fixed abrasives; and the fluid is substantially free of abrasives.

30. A method for removing doped silicon dioxide from a front surface of a substrate with an endless belt having a polishing surface thereon the polishing surface having a constant pressure (P) upon the front surface of the substrate, said method comprising:

for each of a plurality of different constant speeds (S) of the polishing surface moving in a constant linear direction relative to the front surface of a first substrate over a fixed time period in a range from about 120 seconds to about 240 seconds at said constant pressure (P), determining a corresponding material removal rate (RR) of said doped silicon dioxide removed from said front surface of said first substrate, where RR is linear for the equation $RR = K_p * P * S$ and where $K_p$ is Preston's coefficient, and evaluating each said S and the corresponding RR thereof so as to derive therefrom a derived speed (DS) of the polishing surface relative to the front surface of said first substrate over said fixed time period at said constant pressure (P) that has the maximum removal of said material;

removing doped silicon dioxide from the front surface of a second substrate that is the same material as that of the front surface of the first semiconductor substrate by moving the polishing surface at a speed of less than DS over said fixed time period at said constant pressure (P).

31. The method of claim 30, wherein:

a fluid is applied to the interface between the polishing surface and the front surface of the first substrate while removing said doped silicon dioxide;

said fluid is applied to the interface between the polishing surface and the front surface of the second substrate while removing said doped silicon dioxide;

the polishing surface comprises fixed abrasives; and the fluid is substantially free of abrasives.

* * * * *

UNITED STATES PATENT AND TRADEMARK OFFICE
CERTIFICATE OF CORRECTION

PATENT NO.    : 6,521,536 B1
DATED         : February 18, 2003
INVENTOR(S)   : Karl M. Robinson It is certified that error appears in the above-identified patent and that said Letters Patent is hereby corrected as shown below:

Column 2,
Line 6, change "processed" to -- process --

Column 5,
Line 65, change "For linear" to -- Linear --
Line 65, change ", it has" to -- have --

Column 8,
Line 58, after "1" insert -- , --

Column 9,
Line 62, after "polishing" delete ","

Column 10,
Line 5, after "interface" insert -- , --
Line 31, delete "selected"

Column 11,
Line 20, before "derived" insert -- a --
Line 64, delete ","

Column 12,
Line 18, delete ","
Line 28, after "thereon" insert -- , --

Signed and Sealed this

Sixth Day of May, 2003

JAMES E. ROGAN
*Director of the United States Patent and Trademark Office*